US009406609B1

(12) United States Patent
Lung

(10) Patent No.: US 9,406,609 B1
(45) Date of Patent: Aug. 2, 2016

(54) OPENING STRUCTURE AND MANUFACTURING METHOD THEREOF AND INTERCONNECTION STRUCTURE

(71) Applicant: MACRONIX International Co., Ltd., Hsinchu (TW)

(72) Inventor: Cheng-Yi Lung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/747,856

(22) Filed: Jun. 23, 2015

(51) Int. Cl.
*H01L 23/52* (2006.01)
*H01L 23/528* (2006.01)
*H01L 21/768* (2006.01)
*H01L 21/02* (2006.01)
*H01L 23/522* (2006.01)

(52) U.S. Cl.
CPC ...... *H01L 23/5283* (2013.01); *H01L 21/02118* (2013.01); *H01L 21/02266* (2013.01); *H01L 21/02271* (2013.01); *H01L 21/02282* (2013.01); *H01L 21/76816* (2013.01); *H01L 21/76829* (2013.01); *H01L 21/76877* (2013.01); *H01L 23/5226* (2013.01)

(58) Field of Classification Search
CPC ............ H01L 23/5283; H01L 23/5226; H01L 21/76816; H01L 21/76822; H01L 21/76877
USPC .......................................................... 257/774
See application file for complete search history.

(56) References Cited

U.S. PATENT DOCUMENTS

| | | | | | |
|---|---|---|---|---|---|
| 7,847,334 | B2* | 12/2010 | Katsumata | ............ | H01L 21/764 257/314 |
| 8,569,829 | B2* | 10/2013 | Kiyotoshi | ......... | H01L 27/11575 257/326 |
| 8,822,285 | B2* | 9/2014 | Hwang | ............... | H01L 23/5283 257/324 |

* cited by examiner

*Primary Examiner* — Luan C Thai
(74) *Attorney, Agent, or Firm* — J.C. Patents

(57) ABSTRACT

In a manufacturing method of an opening structure, a multi-layer structure including alternately stacked conductive layers and first dielectric layers is formed on a substrate. The conductive layers in a first region are lower than those in a second region. A second dielectric layer covering the multi-layer structure is formed. A patterned mask layer is formed on the second dielectric layer. A first filling layer covering the second dielectric layer exposed by the patterned mask layer is formed in the second region. First openings exposing the conductive layers in the first region are formed by using the first filling layer and the patterned mask layer as a mask. The first filling layer is removed. A second filling layer filling the first openings is formed. Second openings exposing the conductive layers in the second region are formed by using the second filling layer and the patterned mask layer as a mask.

19 Claims, 7 Drawing Sheets

OPENING STRUCTURE AND MANUFACTURING METHOD THEREOF AND INTERCONNECTION STRUCTURE

BACKGROUND OF THE INVENTION

1. Field of the Invention

The invention relates to an opening structure, a manufacturing method thereof, and an interconnection structure; more particularly, the invention relates to an opening structure, a manufacturing method thereof, and an interconnection structure applicable to a three-dimensional (3D) semiconductor device.

2. Description of Related Art

With the integration of semiconductor devices, in order to achieve high density and high performance, development of semiconductor devices in the three-dimensional (3D) space within a limited unit area has become the trend. Common 3D semiconductor devices include 3D-NAND flash memories of the non-volatile memories.

In an exemplary 3D-NAND flash memory, a multi-layer pad structure shaped as a staircase allows contacts to be respectively connected to different film layers in a multi-layer device. Since the aspect ratio of the shallowest contact significantly differs from the aspect ratio of the deepest contact, an etching process for forming the contacts requires an etch stop layer.

If the number of layers of the multi-layer pad structure is relatively small, the etching process for forming the contacts can properly stop on the etch stop layer. Nevertheless, as the number of layers of the multi-layer pad structure shaped as a staircase increases, the thickness of the etch stop layer need be increased significantly, such that the etching process for forming the contacts can properly stop on the etch stop layer.

Thereby, the significant increase in the thickness of the etch stop layer leads to the reduction of the space of the contacts and the resultant reduction of the process window. As such, the contacts cannot be effectively connected to the pads.

SUMMARY OF THE INVENTION

The invention is directed to an opening structure and a manufacturing method thereof, whereby the process window of an etching process for forming openings can be effectively improved.

The invention is further directed to an interconnection structure that can be effectively connected to corresponding conductive layers.

In an embodiment of the invention, a manufacturing method of an opening structure includes following steps. A multi-layer structure is formed on a substrate. The multi-layer structure includes a plurality of conductive layers and a plurality of first dielectric layers, and the conductive layers and the first dielectric layers are alternately stacked. Heights of the conductive layers located in a first region are lower than heights of the conductive layers located in a second region. A second dielectric layer covering the multi-layer structure is formed. A patterned mask layer is formed on the second dielectric layer. A first filling layer is formed in the second region. The first filling layer covers the second dielectric layer exposed by the patterned mask layer. First openings exposing the conductive layers in the first region are formed by using the first filling layer and the patterned mask layer as a mask. The first filling layer is removed. A second filling layer filling the first openings is formed. Second openings exposing the conductive layers in the second region are formed by using the second filling layer and the patterned mask layer as a mask.

According to an embodiment of the invention, the multi-layer structure described in the manufacturing method is a staircase structure, for instance.

According to an embodiment of the invention, the manufacturing method further includes conformally forming an etch stop layer on the multi-layer structure before forming the second dielectric layer.

According to an embodiment of the invention, the manufacturing method further includes removing a portion of the second dielectric layer by using the patterned mask layer as a mask to form a plurality of mask openings in the second dielectric layer before forming the first filling layer.

According to an embodiment of the invention, in the manufacturing method, the step of forming the first filling layer includes following steps. A first filling material layer covering the patterned mask layer and the second dielectric layer is formed. A patterned photoresist layer is formed on the first filling material layer in the second region. The first filling material layer in the first region is removed by using the patterned photoresist layer as a mask.

According to an embodiment of the invention, in the manufacturing method, a material of the first filling material layer is an organic dielectric material, for instance.

According to an embodiment of the invention, in the manufacturing method, a method of forming the first filling material layer is spin coating, for instance.

According to an embodiment of the invention, in the manufacturing method, the step of forming the first openings include following steps. The second dielectric layer and the first dielectric layer located in the first region and exposed by the patterned mask layer are removed by using the first filling layer and the patterned mask layer as a mask.

According to an embodiment of the invention, in the manufacturing method, the step of forming the second filling layer includes following steps. A second filling material layer covering the patterned mask layer and the second dielectric layer and filling the first openings is formed. An etch back process is performed on the second filling material layer to remove the second filling material layer in the second region and expose the second dielectric layer in the second region.

According to an embodiment of the invention, in the manufacturing method, a material of the second filling material layer is an organic dielectric material or a conductive material, for instance.

According to an embodiment of the invention, in the manufacturing method, a method of forming the second filling material layer is spin coating, physical vapor deposition (PVD), or chemical vapor deposition (CVD), for instance.

According to an embodiment of the invention, in the manufacturing method, a top surface of the second filling layer is lower than top portions of the first openings, for instance.

According to an embodiment of the invention, in the manufacturing method, the step of forming the second openings include following steps. The second dielectric layer and the first dielectric layer located in the second region and exposed by the patterned mask layer are removed by using the second filling layer and the patterned mask layer as a mask.

In an embodiment of the invention, an opening structure that includes a substrate, a multi-layer structure, and a second dielectric layer is provided. The multi-layer structure is disposed on the substrate. The multi-layer structure includes a plurality of conductive layers and a plurality of first dielectric layers, and the conductive layers and the first dielectric layers are alternately stacked. Heights of the conductive layers located in a first region are lower than heights of the conductive layers located in a second region. The second dielectric layer covers the multi-layer structure and has a first openings and a second openings. The first opening exposes one of the conductive layers in the first region, and the second opening exposes one of the conductive layers in the second region. A profile of the first opening is different from a profile of the second opening, and a top width of the first opening is greater than a bottom width of the first opening.

According to an embodiment of the invention, the multi-layer structure in the opening structure is a staircase structure, for instance.

According to an embodiment of the invention, the opening structure further includes an etch stop layer. The etch stop layer is conformally disposed on the multi-layer structure.

In an embodiment of the invention, an interconnection structure that includes a substrate, a multi-layer structure, a second dielectric layer, a plurality of second conductive layers, and a plurality of third conductive layers is provided. The multi-layer structure is disposed on the substrate. The multi-layer structure includes a plurality of first conductive layers and a plurality of first dielectric layers, and the first conductive layers and the first dielectric layers are alternately stacked. Heights of the first conductive layers located in a first region are lower than heights of the conductive layers located in a second region. A second dielectric layer covers the multi-layer structure. The second conductive layers and the third conductive layers are disposed in the second dielectric layer. The second conductive layers are connected to the first conductive layers in the first region, and the third conductive layers are connected to the first conductive layers in the second region. Profiles of the second conductive layers are different from profiles of the third conductive layers, and top widths of the second conductive layers are greater than bottom widths of the second conductive layers.

According to an embodiment of the invention, the multi-layer structure in the interconnection structure is a staircase structure, for instance.

According to an embodiment of the invention, the interconnection structure further includes an etch stop layer. The etch stop layer is conformally disposed on the multi-layer structure.

According to an embodiment of the invention, each of the second conductive layers in the interconnection structure includes a bottom conductive layer and a top conductive layer. The bottom conductive layer is connected to a corresponding one of the first conductive layers. The top conductive layer is disposed on the bottom conductive layer.

Based on the above, in the opening structure and the manufacturing method thereof, the first filling layer and the second filling layer allow the etching process to be performed on separate regions. Therefore, even though the number of layers of the multi-layer structure increases, the thickness of the etch stop layer need not be increased; what is more, the etch stop layer may be omitted. As such, the process window of the etching process for forming the openings can be effectively improved. Moreover, the interconnection structure described herein can be effectively connected to corresponding conductive layers.

Several exemplary embodiments accompanied with figures are described in detail below to further describe the invention in details.

DETAILED DESCRIPTION OF DISCLOSED EMBODIMENTS

FIG. 1A to FIG. 1H are cross-sectional views illustrating a manufacturing process of an interconnection structure according to an embodiment of the invention.

Figure 1A:
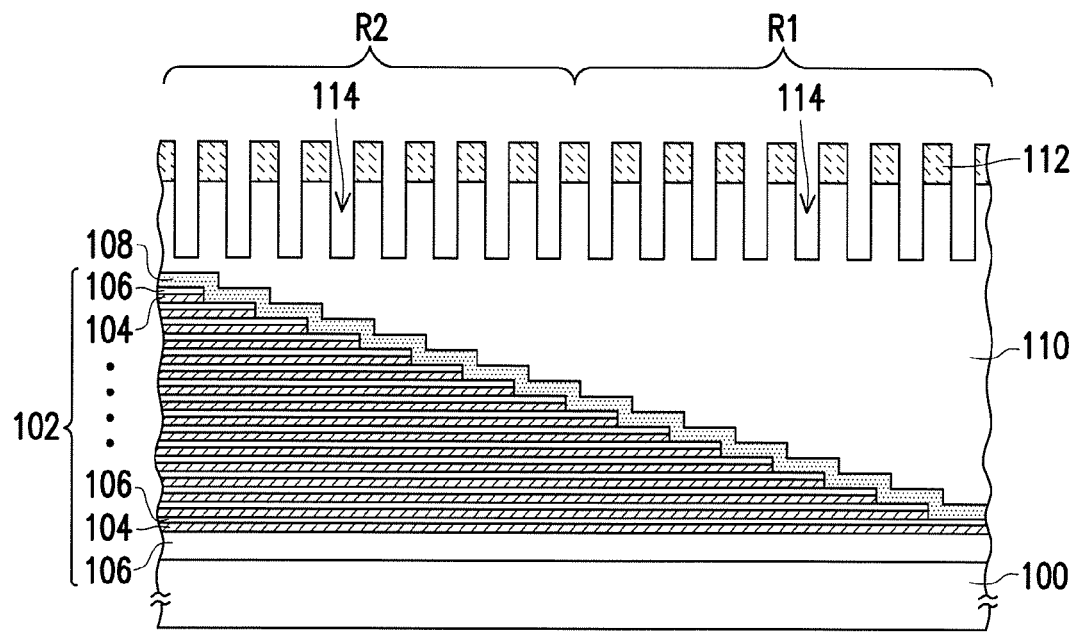
FIG. 1A to FIG. 1H are cross-sectional views illustrating a manufacturing process of an interconnection structure according to an embodiment of the invention.

With reference to FIG. 1A, a multi-layer structure 102 is formed on a substrate 100. The multi-layer structure 102 includes a plurality of conductive layers 104 and a plurality of dielectric layers 106, and the conductive layers 104 and the dielectric layers 106 are alternately stacked. Heights of the conductive layers 104 located in a first region R1 are lower than heights of the conductive layers 104 located in a second region R2. In the present embodiment, the multi-layer structure 102 is a staircase structure, for instance, which should however not be construed as a limitation to the invention. As long as the multi-layer structure 102 can be separated into different regions according to the heights of the conductive layers 104, the multi-layer structure would fall within the scope of the invention and do not depart from the spirit of the invention. In addition, in the present embodiment, the number of the first region R1 is one, and so is the number of the second region R2; however, people having ordinary skill in the pertinent art are able to adjust the number of the first regions R1 and the second regions R2 based on the type and the number of layers of the multi-layer structure 102, and the manufacturing capabilities.

The multi-layer structure 102 is formed by collectively performing a deposition process and a patterning process, for instance. A material of the conductive layers 104 is, for instance, a conductive material, such as doped polysilicon or metal (e.g., copper or tungsten). A method of forming the conductive layers 104 includes, for instance, physical vapor deposition (PVD) or chemical vapor deposition (CVD). The dielectric layers 106 are made of silicon oxide, for example. A method for forming the dielectric layers 106 is, for example, CVD.

An etch stop layer 108 can be alternatively formed on the multi-layer structure 102 conformally. The etch stop layer 108 is made of silicon nitride, for instance. A method of forming the etch stop layer 108 is, for instance, CVD. In another embodiment of the invention, if the etching selectivity ratio of a dielectric layer 110 formed on the conductive layers 104 to the conductive layers 104 is high enough, the etch stop layer 108 may not be formed.

The dielectric layer 110 covering the multi-layer structure 102 is formed on the etch stop layer 108. The dielectric layer 110 is made of silicon oxide, for example. A method for forming the dielectric layer 110 is, for example, CVD. A planarization process, e.g., a chemical-mechanical polishing process, may be further performed on the dielectric layer 110 in an alternative embodiment.

A patterned mask layer 112 is formed on the dielectric layer 110. The patterned mask layer 112 is, for example, made of silicon nitride, silicon oxynitride, amorphous silicon, or polysilicon. A method of forming the patterned hard layer 112 includes, for instance, forming a mask layer (not shown) on the dielectric layer 110 and patterning the mask layer.

A portion of the dielectric layer 110 may be removed by using the patterned mask layer 112 as a mask in an alternative embodiment, so as to form a plurality of mask openings 114 in the dielectric layer 110. A method of removing the portion of the dielectric layer 110 is, for instance, dry etching. In another embodiment of the invention, the mask openings 114 may not be formed.

Figure 1B:
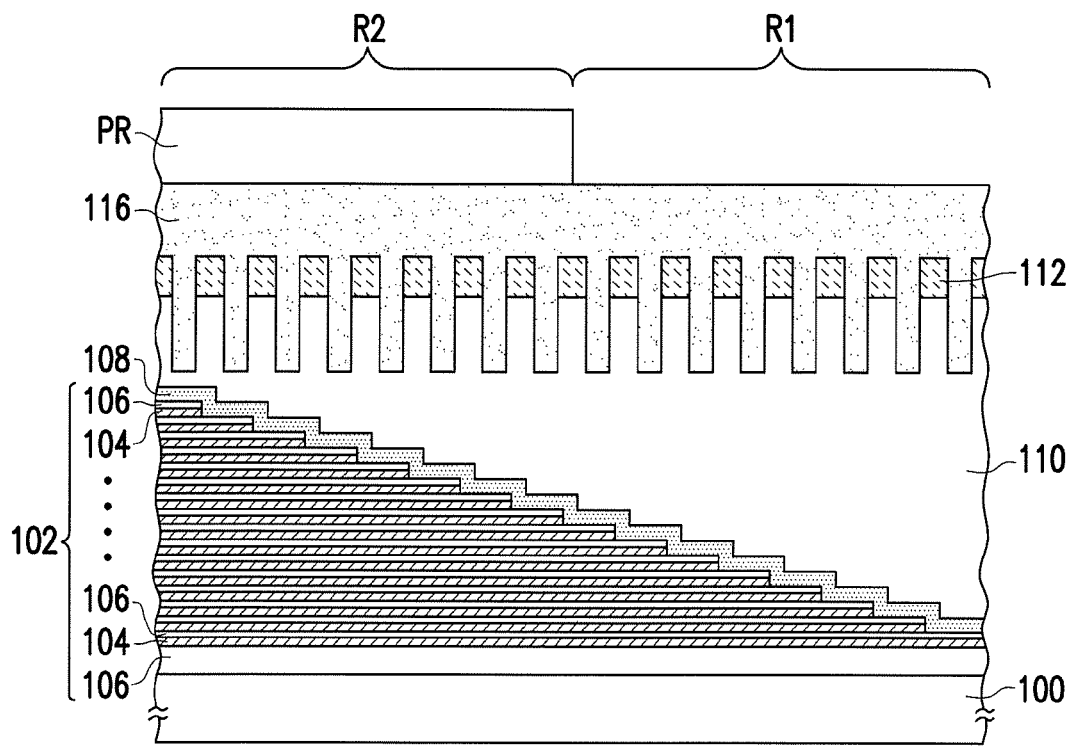

With reference to FIG. 1B, a filling material layer 116 covering the patterned mask layer 112 and the dielectric layer 110 is formed. Furthermore, the mask openings 114 may be filled with the filling material layer 116. The filling material layer 116 is made of an organic dielectric material, for instance. A method of forming the filling material layer 116 is, for instance, spin coating.

A patterned photoresist layer PR is formed on the filling material layer 116 in the second region R2. The patterned photoresist layer PR is made of an organic photoresist material, for instance. A method of forming the patterned photoresist layer PR is, for instance, lithography.

Figure 1C:
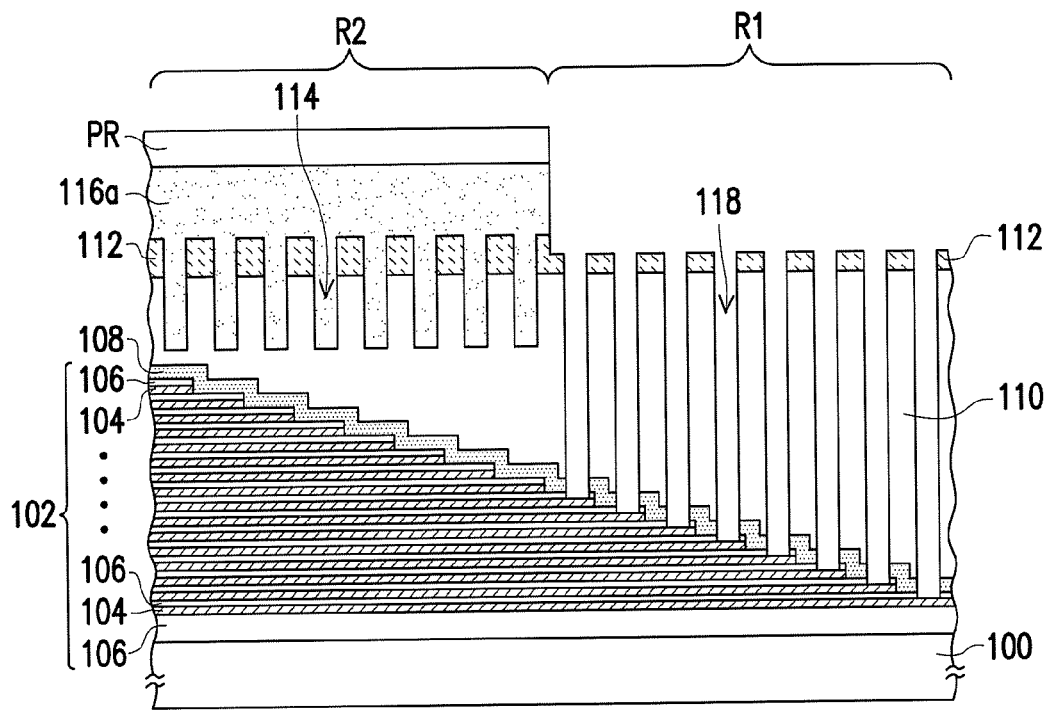

With reference to FIG. 1C, the filling material layer 116 in the first region R1 is removed by using the patterned photoresist layer PR as a mask to form a filling layer 116*a* in the second region R2. The filling layer 116*a* covers the dielectric layer 110 exposed by the patterned mask layer 112. A method of removing the filling material layer 116 in the first region R1 is dry etching, for instance. Although the filling layer 116*a* is formed by applying said method, the invention is not limited thereto; as long as the filling layer 116*a* covering the dielectric layer 110 is formed in the second region R2, the filling layer 116*a* falls within the scope of protection as described herein.

The dielectric layer 110, the etch stop layer 108, and the dielectric layer 106 located in the first region R1 and exposed by the patterned mask layer 112 are removed by using the filling layer 116*a* and the patterned mask layer 112 as a mask, such that the mask openings 114 in the first region R1 are extended downward to form openings 118 exposing the conductive layers 104 in the first region R1. The dielectric layer 110, the etch stop layer 108, and the dielectric layer 106 located in the first region R1 and exposed by the patterned mask layer 112 are, for instance, respectively removed by dry etching. Besides, in process of forming the openings 118, a portion of the patterned mask layer 112 in the first region R1 and a portion of the patterned photoresist layer PR in the second region R2 may be removed.

Figure 1D:
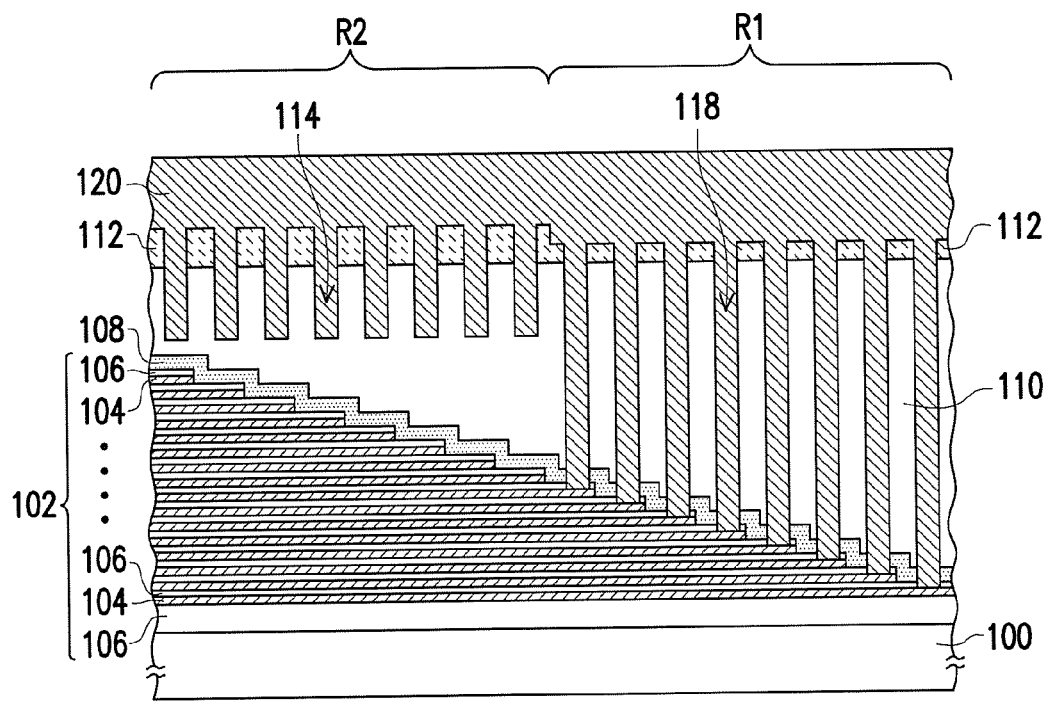

With reference to FIG. 1D, the patterned photoresist layer PR and the filling layer 116*a* are removed. The patterned photoresist layer PR may be removed during the etching process performed for forming the openings 118 or may be individually removed by performing a dry photoresist removing process. A method for removing the filling layer 116*a* includes, for instance, dry etching.

A filling material layer 120 covering the patterned mask layer 112 and the dielectric layer 110 and filling the openings 118 and the mask openings 114 is formed. A material of the filling material layer 120 is, for instance, an organic dielectric material or a conductive material. Here, the conductive material is tungsten, copper, or other metal, for instance. A method of forming the filling material layer 120 is, for instance, spin coating, physical vapor deposition (PVD), or a chemical vapor deposition (CVD). According to the present embodiment, the filling material layer 120 is made of an organic dielectric material formed by spin coating, for instance.

Figure 1E:
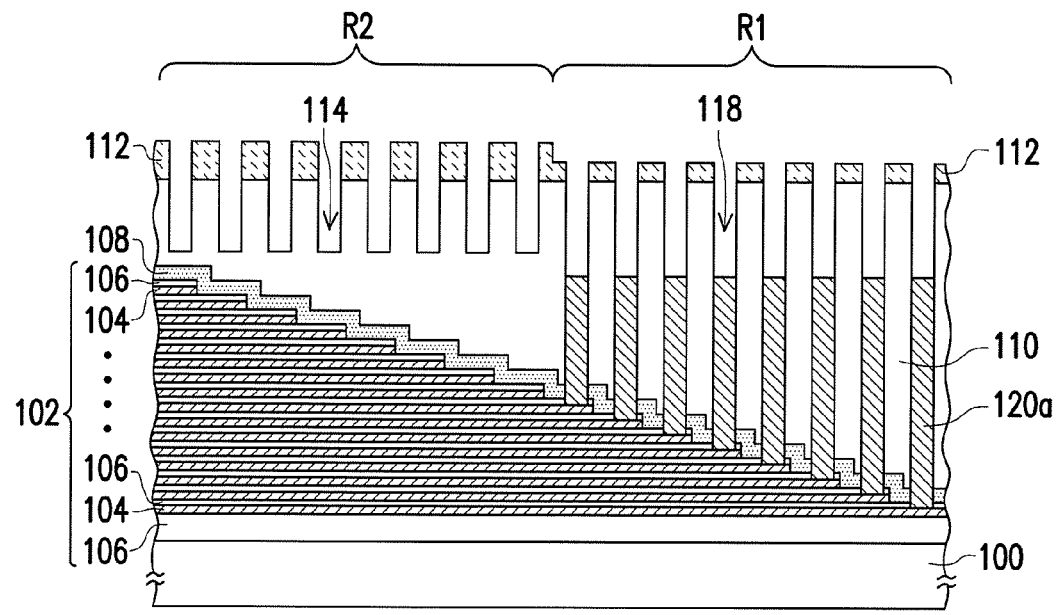

With reference to FIG. 1E, an etch back process is performed on the filling material layer 120 to remove the filling material layer 120 in the second region R2 to expose the dielectric layer 110 in the second region R2 and form the filling layer 120*a* filling the openings 118. A top surface of the filling layer 120*a* is lower than top portions of the openings 118, for instance. Besides, although the filling layer 120*a* is formed by applying said method, the invention is not limited thereto; as long as the filling layer 120*a* filling the openings 118 is formed in the first region R1, the filling layer 120*a* falls within the scope of protection described herein.

Figure 1F:
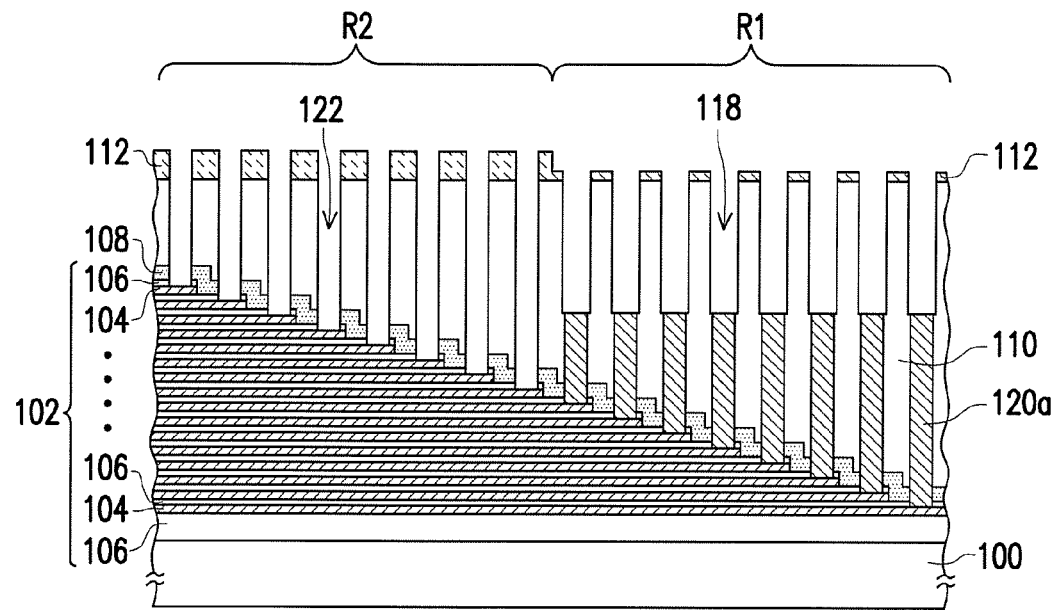

With reference to FIG. 1F, the dielectric layer 110, the etch stop layer 108, and the dielectric layer 106 located in the second region R2 and exposed by the patterned mask layer 112 are removed by using the filling layer 120*a* and the patterned mask layer 112 as a mask, such that the mask openings 114 in the second region R2 are extended downward to form openings 122 exposing the conductive layers 104 in the second region R2 are formed. The dielectric layer 110, the etch stop layer 108, and the dielectric layer 106 located in the second region R2 and exposed by the patterned mask layer 112 are, for instance, respectively removed by dry etching. In the present embodiment, after the etching process for forming the openings 122 is performed, top widths of the openings 118 are greater than bottom widths of the openings 118 because the filling layer 120*a* may serve to protect the bottom portions of the openings 118. Besides, in process of forming the openings 118, a portion of the patterned mask layer 112 and a portion of the filling layer 120*a* may be removed.

At this time, the opening structure including the openings 118 and 122 is formed according to the present embodiment. Here, the openings 118 and the openings 122 may be holes (e.g., contact holes) or trenches (conductive line trenches), respectively.

Based on the above, in the manufacturing method of the opening structure provided in the above embodiment, the filling layer 116*a* and the filling layer 120*a* allow the etching process to be performed on separate regions. That is, while the openings 118 are formed, the filling layer 116*a* may serve to cover the dielectric layer 110 in the second region R2; while the openings 122 are formed, the filling layer 120*a* may serve to protect the conductive layers 104 located in the first region R1 and exposed by the openings 118. Thereby, as the number of layers of the multi-layer structure 102 increases, the thickness of the etch stop layer 108 need not be increased; what is more, the etch stop layer 108 may be omitted. As such, the process window of the etching process for forming the openings 118 and 122 can be effectively improved.

Figure 1G:
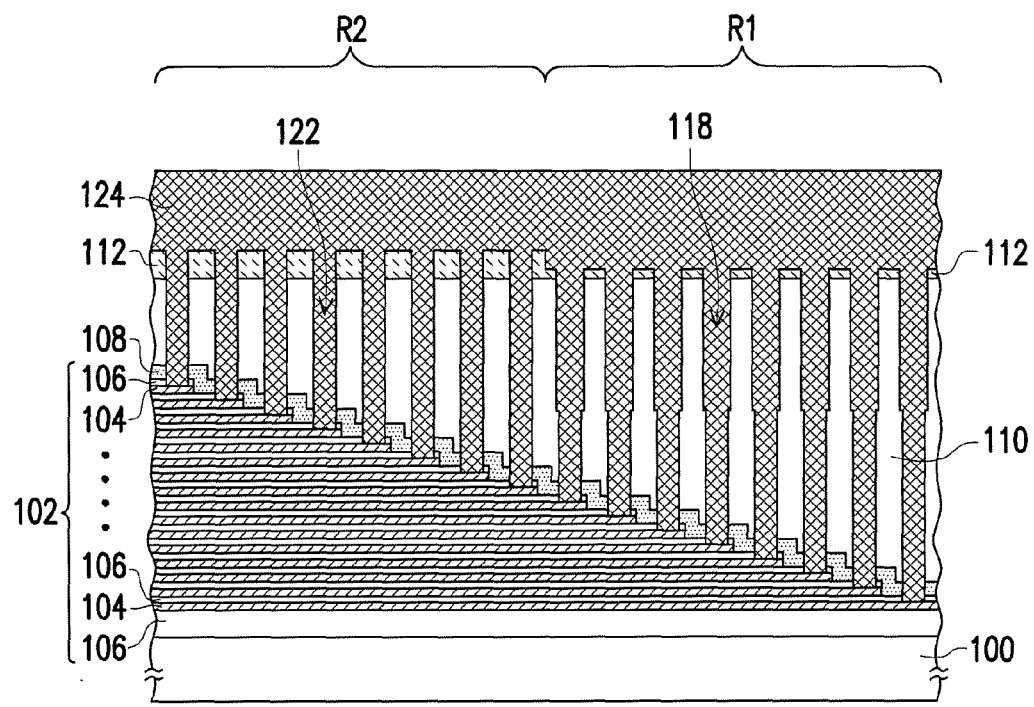

With reference to FIG. 1G, the filling layer 120*a* is removed. A method for removing the filling layer 120*a* includes, for instance, dry etching.

A conductive material layer 124 is then formed, and the openings 118 and 122 are filled with the conductive material layer 124. The conductive material layer 124 can further cover the patterned mask layer 112. A material of the conductive material layer 124 is, for example, metal, such as tungsten, copper, and so forth. A method of forming the conductive material layer 124 is PVD, for instance.

Figure 1H:
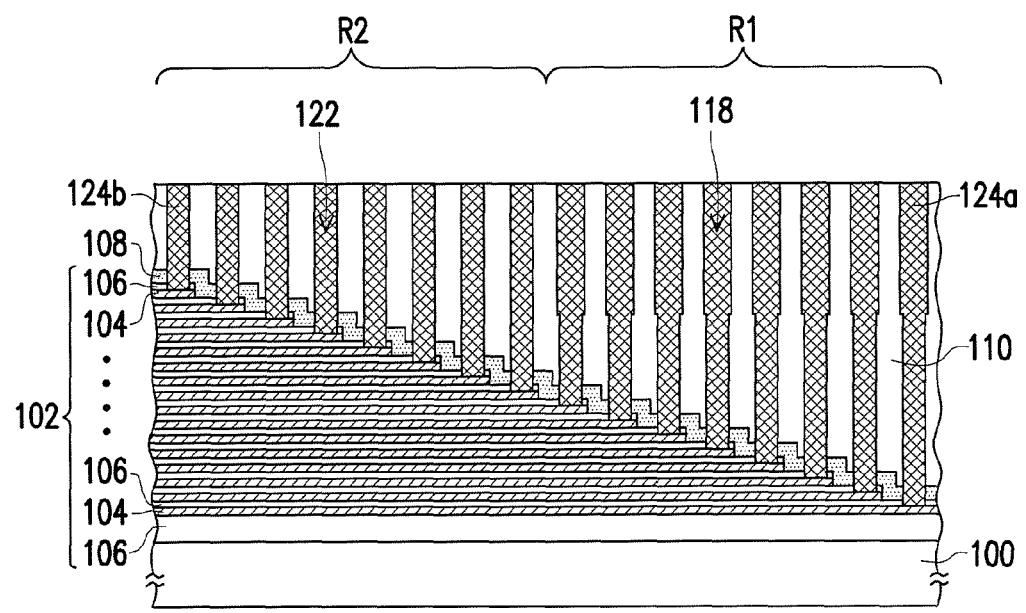

With reference to FIG. 1H, the conductive material layer 124 outside the openings 118 and 122 is removed to form the conductive layers 124*a* and 124*b* respectively in the openings 118 and 122. The conductive layers 124*a* are connected to the conductive layers 104 in the first region R1, and the conductive layers 124*b* are connected to the conductive layers 104 in the second region R2. Profiles of the conductive layers 124*a* are different from profiles of the conductive layers 124*b*, and top widths of the conductive layers 124*a* are greater than bottom widths of the conductive layers 124*a*. The top and bottom widths of the conductive layers 124*b* are substantially the same, for example. A method of removing the conductive material layer 124 outside the openings 118 and 122 includes a chemical-mechanical polishing method or an etch back method, for example. According to the present embodiment, the patterned mask layer 114 can be removed together with the removal of the conductive material layer 124 outside the openings 118 and 122. In another embodiment, the patterned mask layer 114 can be removed before the conductive material layer 124 is formed.

At this time, the interconnection structure including the conductive layers 124a and 124b is formed according to the present embodiment. The conductive layers 124a and 124b may respectively serve as contacts or conductive wires.

In view of the above, the conductive layers 124a and 124b in the interconnection structure can be respectively aligned to the corresponding conductive layers 104 in an accurate manner according to the previous embodiment and can thus be effectively connected to the corresponding conductive layers 104.

Besides, the opening structure, the interconnection structure and the manufacturing method thereof described above can be applied to form various types of semiconductor devices (e.g., 3D-NAND flash memory in a 3D semiconductor device) with the multi-layer structure 102.

Figure 2A:
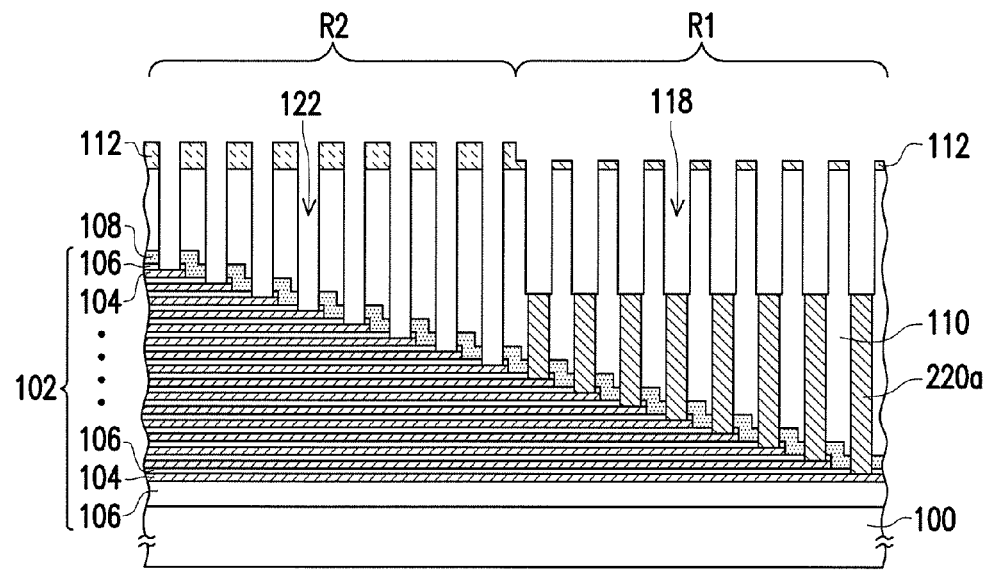
FIG. 2A to FIG. 2C are cross-sectional views illustrating a manufacturing process of an interconnection structure according to another embodiment of the invention.
Figure 2B:
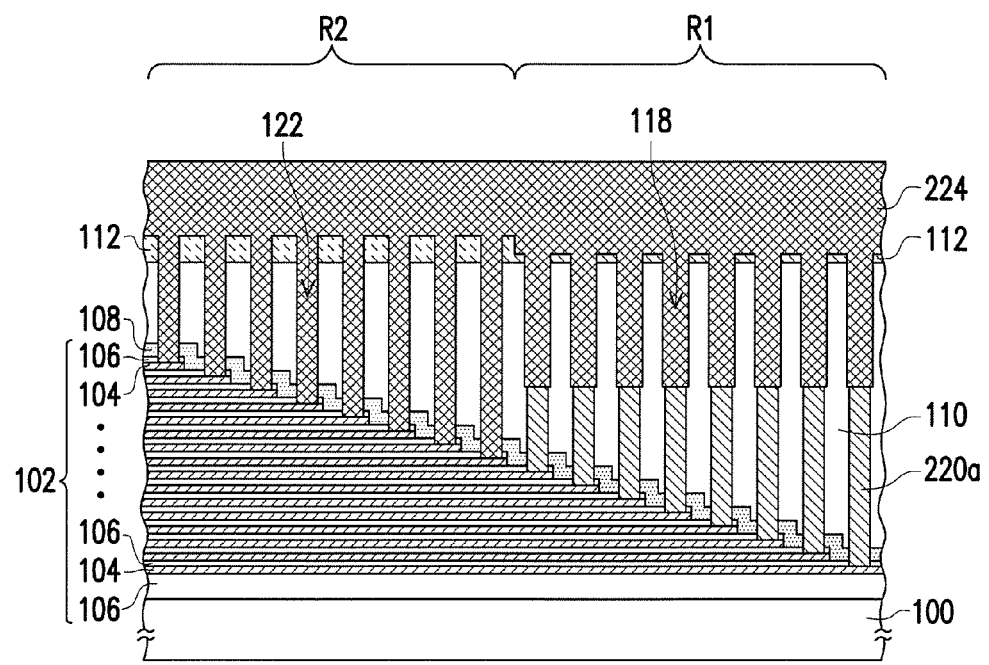
Figure 2C:
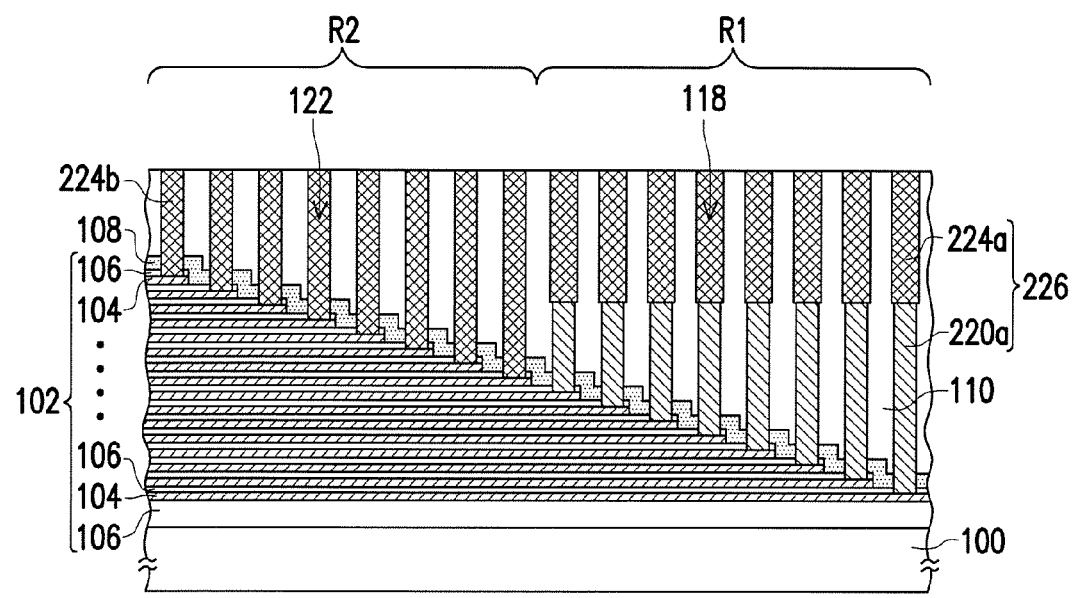

FIG. 2A to FIG. 2C are cross-sectional views illustrating a manufacturing process of an interconnection structure according to another embodiment of the invention.

With reference to FIG. 2A and FIG. 1F, the difference therebetween lies in that the material of the filling layer 220a shown in FIG. 2A is different from the material of the filling layer 120a shown in FIG. 1F. Specifically, the material of the filling layer 220a shown in FIG. 2A is a conductive material (e.g., metal, such as tungsten, copper, and so on), for instance. The arrangement, the materials, the manufacturing method, and the effects of other components depicted in FIG. 2A are similar to those depicted in FIG. 1F; hence, the same reference numbers are applied, and repetitive descriptions are omitted hereinafter.

With reference to FIG. 2B, a conductive material layer 224 is formed, and the openings 118 and 122 are filled with the conductive material layer 224. The conductive material layer 224 can further cover the patterned mask layer 112. A material of the conductive material layer 224 is, for example, metal, such as tungsten, copper, and so forth. A method of forming the conductive material layer 224 is PVD, for instance.

With reference to FIG. 2C, the conductive material layer 224 outside the openings 118 and 122 is removed to form the conductive layers 224a and 224b respectively in the openings 118 and 122. The conductive layers 224a and the filling layers 220a form the conductive layers 226, and there are contact surfaces between the conductive layers 224a and the filling layers 220a. The conductive layers 226 are connected to the conductive layers 104 in the first region R1, and the conductive layers 224b are connected to the conductive layers 104 in the second region R2. Profiles of the conductive layers 226 are different from profiles of the conductive layers 224b, and top widths of the conductive layers 226 are greater than bottom widths of the conductive layers 226. The top and bottom widths of the conductive layers 224b are substantially the same, for example. According to the present embodiment, the patterned mask layer 114 can be removed together with the removal of the conductive material layer 224 outside the openings 118 and 122. In another embodiment, the patterned mask layer 114 can be removed before the conductive material layer 224 is formed.

At this time, the interconnection structure including the conductive layers 226 and 224b is formed according to the present embodiment. The conductive layers 226 and 224b may respectively serve as contacts or conductive wires.

In the present embodiment, two fill-in processes are performed to respectively form the conductive layers 224a and the filling layers 220a, so as to form the conductive layers 226. The resultant conductive layers 226 can have better fill-in capabilities, and voids are not generated in the conductive layers 226 which prevent the increase in the resistance of the conductive layers 226.

It can be derived from the above that the opening structure and the manufacturing method thereof provided above can be applied to effectively improve the process window of the etching process for forming the openings 118 and 122. Moreover, the conductive layers 226 and 224b in the interconnection structure described above can be effectively connected to the corresponding conductive layers 104.

Figure 3:
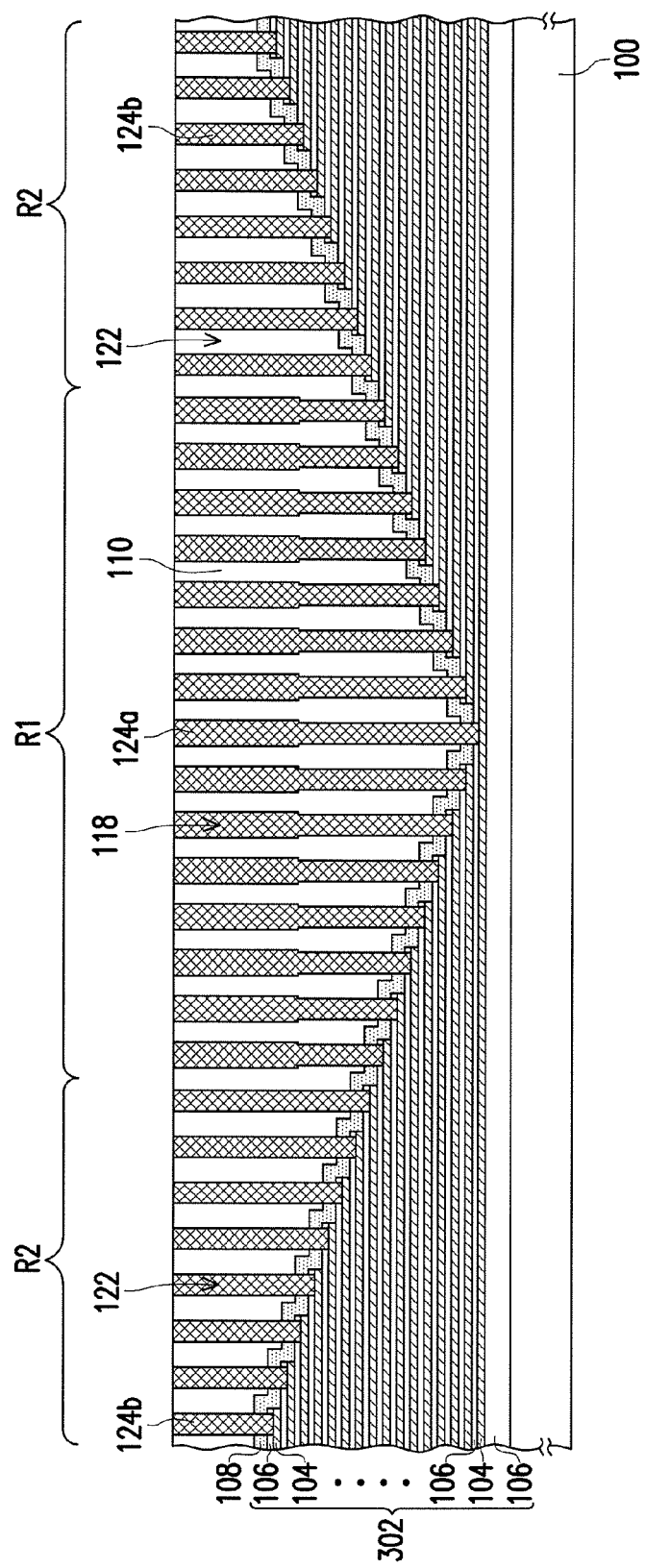
FIG. 3 is a cross-sectional view illustrating an interconnection structure according to another embodiment of the invention.

FIG. 3 is a cross-sectional view illustrating an interconnection structure according to another embodiment of the invention.

With reference to FIG. 3 and FIG. 1H, the difference therebetween lies in that the multi-layer structure 302 shown in FIG. 3 is different from the multi-layer structure 102 shown in FIG. 1H. In FIG. 3, the multi-layer structure 302 has one first region R1 and two second regions R2. The arrangement, the materials, the manufacturing method, and the effects of other components depicted in FIG. 3 are similar to those depicted in FIG. 1H; hence, the same reference numbers are applied, and repetitive descriptions are omitted hereinafter.

The opening structure provided in the above embodiment is elaborated with reference of FIG. 1F and FIG. 2A.

As shown in FIG. 1F and FIG. 2A, the opening structure includes a substrate 100, a multi-layer structure 102, and a dielectric layer 110. The multi-layer structure 102 is disposed on the substrate 100. The multi-layer structure 102 includes a plurality of conductive layers 104 and a plurality of dielectric layers 106, and the conductive layers 104 and the dielectric layers 106 are alternately stacked. Heights of the conductive layers 104 located in a first region R1 are lower than heights of the conductive layers 104 located in a second region R2. The dielectric layer 110 covers the multi-layer structure 102 and has a plurality of openings 118 and a plurality of openings 122. Each of the openings 118 exposes one of the conductive layers 104 in the first region R1, and each of the openings 122 exposes one of the conductive layers 104 in the second region R2. Profiles of the openings 118 are different from profiles of the openings 122, and top widths of the openings 118 are greater than bottom widths of the openings 118. The opening structure may selectively include an etch stop layer 108. The etch stop layer 108 is conformally disposed on the multi-layer structure 102. The arrangement, the materials, the manufacturing method, and the effects of other components depicted in FIG. 1F and FIG. 2A are already elaborated above, and therefore repetitive descriptions are omitted hereinafter.

The interconnection structure provided in the above embodiment is elaborated with reference of FIG. 1H and FIG. 2C.

As shown in FIG. 1H, the interconnection structure includes a substrate 100, a multi-layer structure 102, a dielectric layer 110, a plurality of conductive layers 124a, and a plurality of conductive layers 124b. The descriptions of the substrate 100, the multi-layer structure 102, and the dielectric layer 110 are provided above and thus will not be repeated hereinafter. The conductive layers 124a and 124b are disposed in the dielectric layer 110. The conductive layers 124a are connected to the conductive layers 104 in the first region R1, and the conductive layers 124b are connected to the conductive layers 104 in the second region R2. Profiles of the conductive layers 124a are different from profiles of the conductive layers 124b, and top widths of the conductive layers 124a are greater than bottom widths of the conductive layers 124a. The top and bottom widths of the conductive layers 124b are substantially the same, for example. The interconnection structure may selectively include an etch stop layer 108. The etch stop layer 108 is conformally disposed on the multi-layer structure 102. The arrangement, the materials, the manufacturing method, and the effects of other components depicted in FIG. 1H are already elaborated above, and therefore repetitive descriptions are omitted hereinafter.

As shown in FIG. 2C and FIG. 1H, interconnection structure depicted in FIG. 2C includes the conductive layers 226 and 224b. The conductive layers 226 are connected to the conductive layers 104 in the first region R1, and the conductive layers 224b are connected to the conductive layers 104 in the second region R2. The difference between FIG. 2C and FIG. 1H lies in that the conductive layers 226 include the filling layers 220a (the bottom conductive layers) and the conductive layers 224a (the top conductive layers). The filling layers 220a are connected to the corresponding conductive layers 104. The conductive layers 224a are located on the filling layers 220a. The arrangement, the materials, the manufacturing method, and the effects of other components depicted in FIG. 2C are similar to those depicted in FIG. 1H; hence, the same reference numbers are applied, and repetitive descriptions are omitted hereinafter.

To sum up, the previous embodiments at least have the following properties. The opening structure and the manufacturing method thereof of the previous embodiments can be applied to effectively improve the process window of the etching process for forming the openings. Moreover, the interconnection structure the previous embodiments can be effectively connected to the corresponding conductive layers.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A manufacturing method of an opening structure, comprising:
    forming a multi-layer structure on a substrate, wherein the multi-layer structure comprises a plurality of conductive layers and a plurality of first dielectric layers, the conductive layers and the first dielectric layers are alternately stacked, and heights of the conductive layers located in a first region are lower than heights of the conductive layers located in a second region;
    forming a second dielectric layer, the second dielectric layer covering the multi-layer structure;
    forming a patterned mask layer on the second dielectric layer;
    forming a first filling layer in the second region, the first filling layer covering the second dielectric layer exposed by the patterned mask layer;
    forming a plurality of first openings by using the first filling layer and the patterned mask layer as a mask, the first openings exposing the conductive layers in the first region;
    removing the first filling layer;
    forming a second filling layer, the second filling layer filling the first openings; and
    forming a plurality of second openings by using the second filling layer and the patterned mask layer as a mask, the second openings exposing the conductive layers in the second region.

2. The manufacturing method of claim 1, wherein the multi-layer structure comprises a staircase structure.

3. The manufacturing method of claim 1, further comprising conformally forming an etch stop layer on the multi-layer structure before forming the second dielectric layer.

4. The manufacturing method of claim 1, further comprising removing a portion of the second dielectric layer by using the patterned mask layer as a mask to form a plurality of mask openings in the second dielectric layer before forming the first filling layer.

5. The manufacturing method of claim 1, wherein the step of forming the first filling layer comprises:
    forming a first filling material layer, the first filling material layer covering the patterned mask layer and the second dielectric layer;
    forming a patterned photoresist layer on the first filling material layer in the second region; and
    removing the first filling material layer in the first region by using the patterned photoresist layer as a mask.

6. The manufacturing method of claim 5, wherein a material of the first filling material layer comprises an organic dielectric material.

7. The manufacturing method of claim 5, wherein a method of forming the first filling material layer comprises spin coating.

8. The manufacturing method of claim 1, wherein the step of forming the first openings comprises:
    removing the second dielectric layer and the first dielectric layer located in the first region and exposed by the patterned mask layer by using the first filling layer and the patterned mask layer as a mask.

9. The manufacturing method of claim 1, wherein the step of forming the second filling layer comprises:
    forming a second filling material layer, the second filling material layer covering the patterned mask layer and the second dielectric layer and filling the first openings; and
    performing an etch back process on the second filling material layer to remove the second filling material layer in the second region and expose the second dielectric layer in the second region.

10. The manufacturing method of claim 9, wherein a material of the second filling material layer comprises an organic dielectric material or a conductive material.

11. The manufacturing method of claim 9, wherein a method of forming the second filling material layer comprises spin coating, physical vapor deposition, or chemical vapor deposition.

12. The manufacturing method of claim 1, wherein a top surface of the second filling layer is lower than top portions of the first openings.

13. The manufacturing method of claim 1, wherein the step of forming the second openings comprises:
    removing the second dielectric layer and the first dielectric layer located in the second region and exposed by the patterned mask layer by using the second filling layer and the patterned mask layer as a mask.

14. An opening structure comprising:
    a substrate;
    a multi-layer structure disposed on the substrate, wherein the multi-layer structure comprises a plurality of conductive layers and a plurality of first dielectric layers, the conductive layers and the first dielectric layers are alternately stacked, and heights of the conductive layers located in a first region are lower than heights of the conductive layers located in a second region; and a second dielectric layer covering the multi-layer structure and having a first opening and a second opening, wherein the first opening exposes one of the conductive layers in the first region, the second opening exposes one of the conductive layers in the second region, a profile of the first opening is different from a profile of the second opening, and a top width of the first opening is greater than a bottom width of the first opening, wherein the first opening has a stepped sidewall, but the second opening does not have a stepped sidewall.

15. The opening structure of claim 14, wherein the multi-layer structure comprises a staircase structure.

16. The opening structure of claim 14, further comprising an etch stop layer conformally disposed on the multi-layer structure.

17. An interconnection structure comprising:

a substrate;

a multi-layer structure disposed on the substrate, wherein the multi-layer structure comprises a plurality of first conductive layers and a plurality of first dielectric layers, the first conductive layers and the first dielectric layers are alternately stacked, and heights of the first conductive layers located in a first region are lower than heights of the first conductive layers located in a second region;

a second dielectric layer covering the multi-layer structure; and a plurality of second conductive layers and a plurality of third conductive layers, the second and third conductive layers being disposed in the second dielectric layer, wherein the second conductive layers are connected to the first conductive layers in the first region, the third conductive layers are connected to the first conductive layers in the second region, profiles of the second conductive layers are different from profiles of the third conductive layers, and top widths of the second conductive layers are greater than bottom widths of the second conductive layers, each of the second conductive layers comprises:
　a bottom conductive layer connected to a corresponding one of the first conductive layers and having the bottom width of the second conductive layer; and
　a top conductive layer disposed on the bottom conductive layer and having the top width of the second conductive layer, wherein there are contact surfaces between the bottom conductive layer and the top conductive layer, and each of the third conductive layers is a single conductive layer.

18. The interconnection structure of claim 17, wherein the multi-layer structure comprises a staircase structure.

19. The interconnection structure of claim 17, further comprising an etch stop layer conformally disposed on the multi-layer structure.

* * * * *